United States Patent
Garbus et al.

(10) Patent No.: US 12,119,621 B1
(45) Date of Patent: Oct. 15, 2024

(54) SELF-INDUCED HIGH VOLTAGE TRIGGER

(71) Applicants: James W. Garbus, Ashland, VA (US); Daniel R. Wise, Colonial Beach, VA (US); Joel M. Mejeur, Fredericksburg, VA (US); Scott R. Douglass, Annandale, VA (US)

(72) Inventors: James W. Garbus, Ashland, VA (US); Daniel R. Wise, Colonial Beach, VA (US); Joel M. Mejeur, Fredericksburg, VA (US); Scott R. Douglass, Annandale, VA (US)

(73) Assignee: United States of America, as represented by the Secretary of the Navy, Arlington, VA (US)

( * ) Notice: Subject to any disclaimer, the term of this patent is extended or adjusted under 35 U.S.C. 154(b) by 0 days.

(21) Appl. No.: 17/476,434

(22) Filed: Sep. 15, 2021

(51) Int. Cl.
*H01T 15/00* (2006.01)
*H03K 3/537* (2006.01)

(52) U.S. Cl.
CPC ............ *H01T 15/00* (2013.01); *H03K 3/537* (2013.01)

(58) Field of Classification Search
CPC .......... H02H 3/205; H03K 3/537; H01T 2/02
USPC ......................................................... 315/248
See application file for complete search history.

(56) References Cited

U.S. PATENT DOCUMENTS

| | | | | |
|---|---|---|---|---|
| 2,137,878 A * | 11/1938 | Kramer | ................... | G01R 19/20 324/120 |
| 2,160,588 A * | 5/1939 | Granfield | ................ | H01F 41/02 29/605 |
| 2,649,567 A * | 8/1953 | Gaetani | ................ | H04B 15/025 324/627 |
| 4,087,800 A * | 5/1978 | Lee | ......................... | B65G 43/02 340/676 |
| 4,810,911 A * | 3/1989 | Noguchi | ............... | H03K 17/693 327/431 |
| 5,490,428 A * | 2/1996 | Durr | ........................ | B01J 4/008 73/861.41 |
| 6,111,740 A * | 8/2000 | Danowsky | ............... | H02H 9/06 361/111 |
| 7,274,333 B1 * | 9/2007 | Alexeff | ..................... | H05H 1/46 343/701 |

* cited by examiner

*Primary Examiner* — Phutthiwat Wongwian
*Assistant Examiner* — Joshua Campbell
(74) *Attorney, Agent, or Firm* — Gerhard W. Thielman

(57) ABSTRACT

A magnetic induction device is provided for triggering an electric spark discharge in response to a variable voltage. The device includes an inductor; a resistor series having first and second resistors; and a discharge device. These are arranged in a receiver circuit in which the inductor, the resistor series and the spark gap are disposed in parallel. The inductor connects between the first and second resistors to a gate electrode of the discharge device. Magnetic flux induces a current into the electrode responsive to the receiver circuit temporarily overlapping the inductor, thereby inducing the spark.

9 Claims, 9 Drawing Sheets

SELF-INDUCED HIGH VOLTAGE TRIGGER

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to spark gap triggers. In particular, the invention relates to current induction via moving circuits or circuits generating high magnetic flux.

SUMMARY

Conventional spark gap triggers yield disadvantages addressed by various exemplary embodiments of the present invention. In particular, various exemplary embodiments provide a magnetic induction device for triggering a spark gap switch. The device includes an inductive voltage generator; and a triggering electrode in a spark gap.

In various embodiments, the device includes first and second inductors; a resistor series having first and second resistors; a connection concatenation. The first inductor, the resistor series and the spark gap are disposed in parallel. The generator is magnetically coupled to a source. The second inductor connects between the first and second resistors to a gate electrode of the spark gap. Magnetic flux induces a voltage into the electrode responsive to the second inductor magnetically coupled to the first inductor.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which.

DETAILED DESCRIPTION

Figure 1:
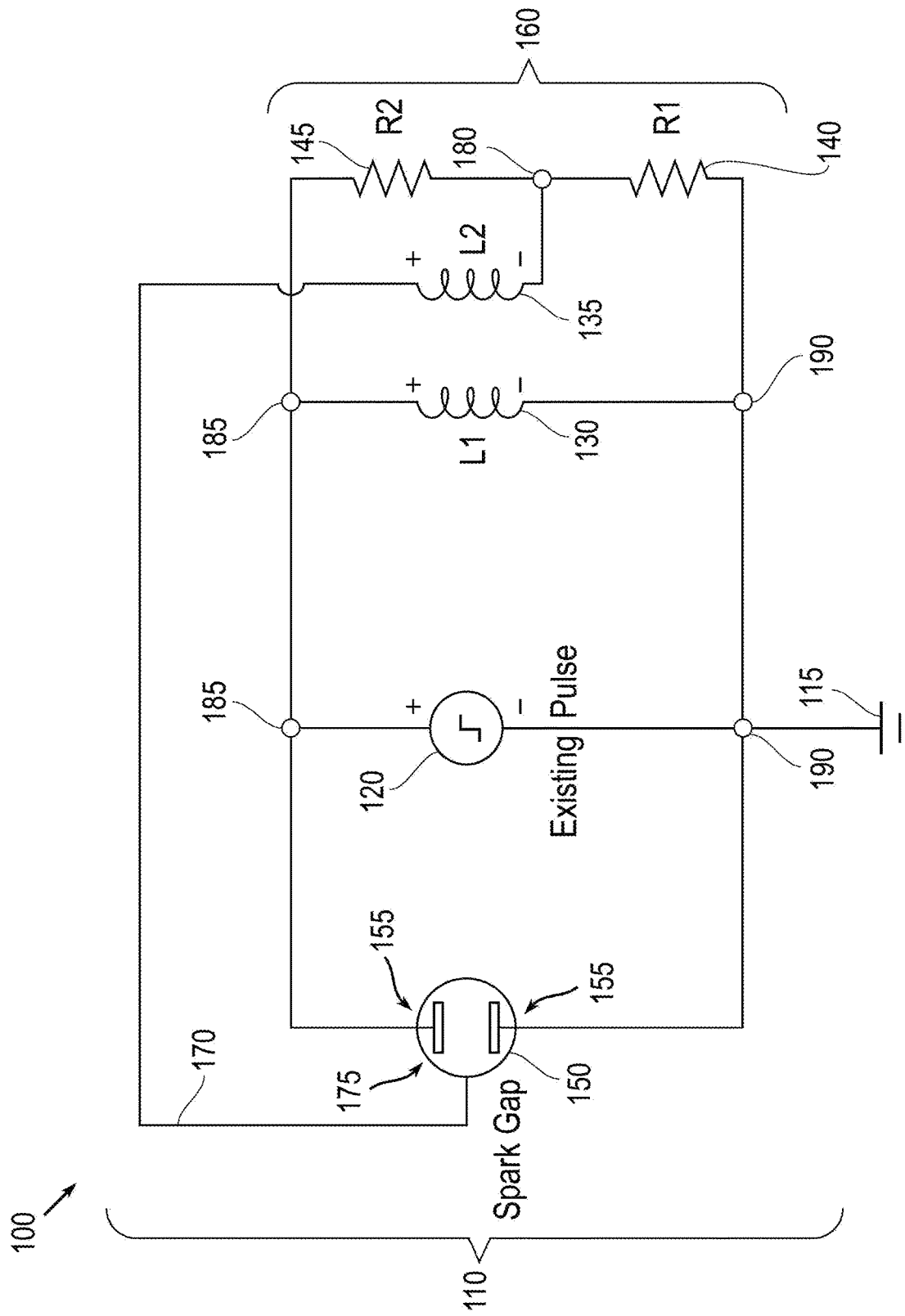
FIG. 1 is a schematic view of an exemplary circuit.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

In accordance with a presently preferred embodiment of the present invention, the components, process steps, and/or data structures may be implemented using various types of operating systems, computing platforms, computer programs, and/or general purpose machines. In addition, artisans of ordinary skill will readily recognize that devices of a less general purpose nature, such as hardwired devices, may also be used without departing from the scope and spirit of the inventive concepts disclosed herewith. General purpose machines include devices that execute instruction code. A hardwired device may constitute an application specific integrated circuit (ASIC), a field programmable gate array (FPGA), digital signal processor (DSP) or other related component.

The disclosure generally employs quantity units with the following abbreviations: length in centimeters (cm), mass in grams (g), time in microseconds (µs), force in newtons (N), electric potential in volts (V), electric current in amperes (A), resistance in ohms (Ω), inductance in henrys (H), capacitance in microfarads (µF), magnetic flux in gauss (G), energy in joules (J), and frequencies in megahertz—(MHz). Supplemental measures can be derived from these, such as electric field in volts-per-centimeter (V/cm), magnetic field intensity in amperes-per-meter (A/m) or oersteds (Oe) and the like.

Exemplary embodiments enable high voltage triggering of a spark gap or other device utilizing the field generated within a high voltage or high current circuit. This switch closure can be employed for a multitude of functions including shorting of the circuit, connection of another circuit or portion of the circuit, and triggering of another discharge or pulse.

Spark gaps and switches are currently used in many applications for shunting, crow bar or current diversion functions. In existing systems these devices are triggered or engaged by a separate driver circuit that must be controlled to achieve proper function and timing. This triggering circuit requires external power, controls and energy storage to function.

Exemplary embodiments provide a magnetic induction trigger device for triggering an electric discharge via a spark gap. This exemplary device may be added to an existing spark gap or integrated into a modular spark gap for a more reliably performing spark gap switch component. The device can be incorporated with existing circuits that contain a variable voltage generator to produce a voltage pulse and a first inductor to divert current from the first inductor by means of a reliable spark gap switch component responsive to the pulse. The device includes a resistor series having first and second resistors; a triggering gate electrode in the spark gap, and a receiving circuit in which the resistor series and the spark gap are disposed in parallel with the voltage generator and the first inductor.

In some embodiments, the device further includes the spark gap electrodes. In addition, the device can include a supplemental inductor that connects between the first and second resistors to the gate electrode of the spark gap. A momentary coupling of magnetic flux from the inductor to the supplemental inductor due to a temporary overlap induces a voltage in the supplemental inductor and the triggering gate, thereby closing the spark gap switch.

The exemplary trigger device takes advantage of the magnetic field of existing circuits as it varies in time or geometry and Faraday's Law shown in the equation to generate a high voltage.

$$E_{gen} = -N\frac{d(BA)}{dt},$$

wherein $E_{gen}$ is voltage potential, N is number of turns, B is magnetic field, A is effective area of inductive geometry. This voltage can then be used to trigger a spark gap or switch to serve a variety of functions. For example, for one-hundred turns, an area of 10 cm² in a varying field between zero and 1.0 kG over an interval of 10 μs, the potential becomes 1.0 kV.

FIG. 1 shows a circuit diagram view 100 of an exemplary device displayed as a schematic circuit 110 having a fixed potential called ground 115. This includes a conventional current pulse generator 120, first and second inductors 130 and 135 (L1 and L2), first and second resistors 140 and 145 (R1 and R2) in series and a spark gap switch 150 bounded by capacitor terminals 155. The first inductor 130 is preferred but optional. The spark gap 150, pulse generator 120, first inductor 130 and resistors 140 and 145 are arranged in a parallel circuit 160. The second inductor 135 is disposed within a series circuit 170 between a trigger pin gate electrode 175 in the spark gap 150 and a resistor node 180 between the resistors 140 and 145.

The gate electrode 175 across the terminals 155 serves as a trigger and connects via the second inductor 135 to the resistor node 180. The pulse generator 120 has positive and negative terminals, which respectively connect to positive and negative nodes 185 and 190. The second resistor 145 as R2 connects between the positive nodes 185 and the resistor node 180. The first resistor 140 as R1 connects between the negative nodes 190 and the resistor node 180.

The positive nodes 185 connect the positive terminal of the pulse generator 120 to the spark gap 150, the first inductor 130 as L1 and the second resistor 145 as R2. The negative nodes 190 connect the negative terminal of the pulse generator 120 to ground 115, the spark gap 150, the first inductor 130 as L1 and the first resistor 140 as R1. The novel aspects include the parallel circuit 160, the spark gap 150 and the generation of a trigger voltage at the gate electrode 175 through transient interaction of the first and second inductors 130 as L1 and 135 as L2.

Utilizing this effect, the exemplary device uses the circuit's energy to generate a desired voltage and the geometric configuration to control timing of at least one triggering event. This exemplary device is novel by using the fields generated by the circuit 110 used to generate voltage and trigger a gap by magnetic flux inducing charge motion that builds up electric potential on the gate electrode 175. The exemplary mechanism comprises an inductive device or coil as inductor 135 (L2), (grading or limiting) resistors 140 and 145 (R1 and R2), and the gate electrode 175 (e.g., an illumination pin) to trigger the spark gap 150 as shown in view 100. The exemplary circuit 110 is not the only possible implementation of the trigger device, which is also capable of driving one of the capacitor electrodes in the spark gap 150 directly. Note that limiting or grading resistors 140 and 145 as shown may be optional in some applications.

Component L1 as inductor 130 represents an existing inductive component of the circuit 110 that is magnetically coupled to component L2 as inductor 135, being an inductive device or coil. Note that component L1 as inductor 130 may not be necessarily designed as an inductor, but rather has some inductance and therefore generates a temporal or geometric altering magnetic field.

Components R1 and R2 constitute grading resistors 140 and 145 that maintain a mid-voltage in-between them. These resistors 140 and 145 also limit the quantity of electric current that flows through component L2 as inductor 145 during triggering. The output of component L2 as inductor 135 connects to a triggering pin or gate electrode of the spark gap 150. When component L1 as inductor 130 generates magnetic flux, it inductively couples to component L2 as inductor 135, which in turn generates a voltage sufficiently high to trigger the spark gap 150.

For purposes of triggering a spark gap 150, a large electric field is required to generate charged particles, either by direct electron emission or by ionizing gas molecules. The charged particles close the spark gap 150 as a switch between the spark gap terminals 155. Large fields require large potentials on the trigger electrode 175, and by disposing the gate electrode 175 (as the trigger) a small distance from one of the spark gap terminals 155, or by field enhancement geometry, as from the point of a pin as the gate electrode 175, ionization of air requires 30 kV/cm.

A peak potential is about 3.0 kV on the gate electrode 175 at a distance of 0.1 cm from the spark gap terminals 155, with field enhancement, is one of the many possible spark gap configurations. Examples for resistances 140 as R1 and 145 as R2 are respectively about 1.0 kΩ each, inductances for components L1 and L2 as inductors 130 and 135 are measured in μH for circuit currents in kA. The inductances become larger as the current in L1 decreases.

The configuration of circuit 110 shown in view 100 acts as a shunt, shorting the system when triggered. The circuit 110 could also be configured to operate as a switch to connect the existing pulse from the generator 120 to another circuit or component. Many such devices could also be operated together to create many trigger events. If components L1 and L2 as inductors 130 and 135 can be coils; the voltage quantity generated can be controlled by selecting any number of turns in either coil.

Figure 2:
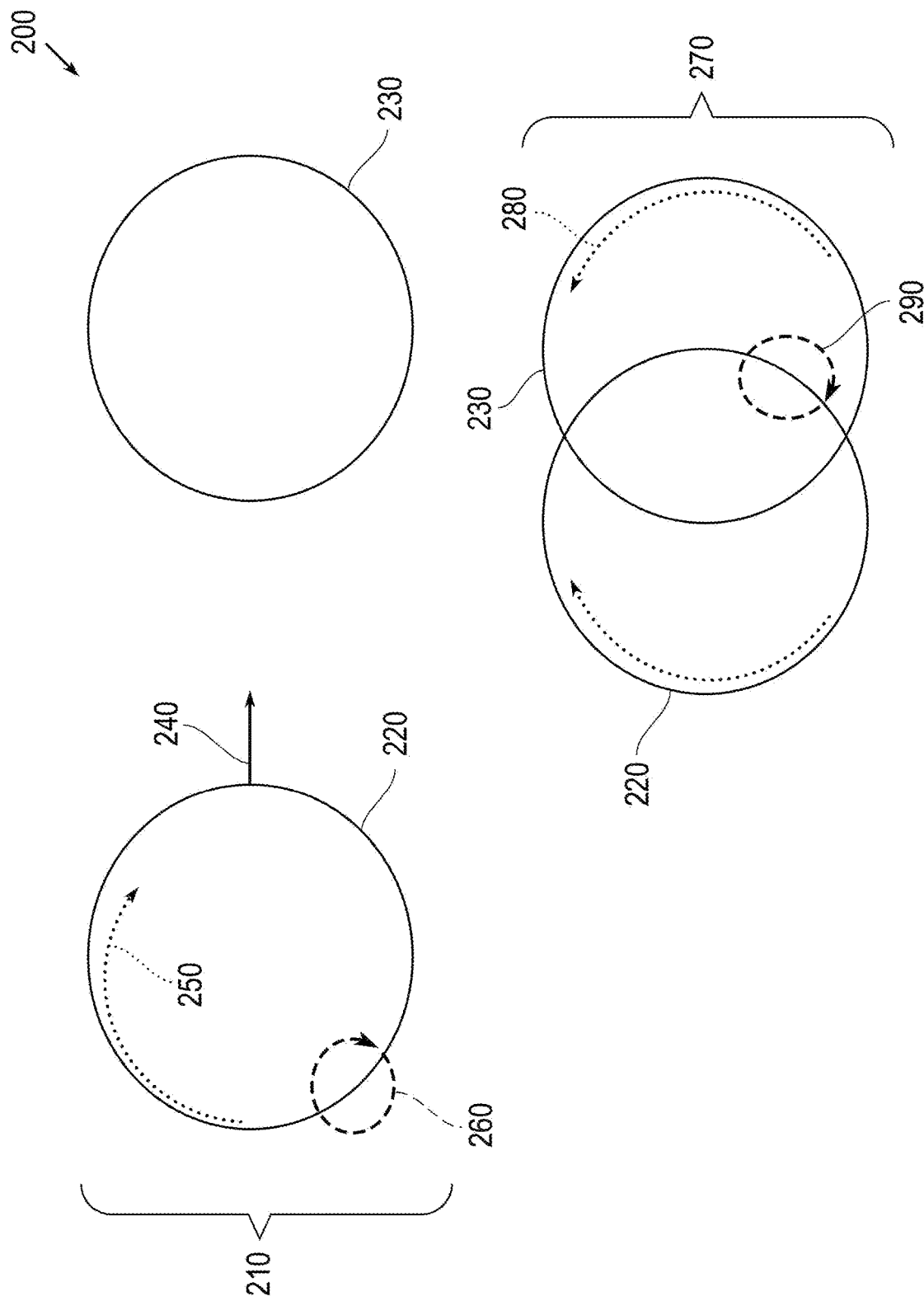
FIG. 2 is a diagram view of flux coupling between inductors via translation.

FIG. 2 shows a diagram view 200 of a first example of geometric generation of changing field in L2 as inductor 135. A first configuration 210 includes an inductive circuit L1 element 220 (shown as a ring) that moves towards a coil L2 element 230 along intercept direction 240. The inductive circuit 220 for L1 as inductor 130 exhibits a clockwise internal current 250 and a second clockwise peripheral magnetic flux 260.

A second configuration 270 represents a configuration 210 a moment later in time and shows the inductive circuit L1 element 220 partly overlapping the coil L2 element 230. Note that the coil L2 element 230 is a closed (short) circuit, to be distinguished from coil L2 inductor 135, which is an open circuit or resistor loaded through the spark gap 150. The translation overlap enables the current 250 to induce an anti-clockwise internal current 280 in the coil L2 element 230 that also envelopes a shared magnetic flux 290 that is a subset of the initially isolated magnetic flux 260.

In this manner, by passing circuit L1 as inductor 130 by coil L2 as inductor 135, thereby is a significantly large rate of change in magnetic field and voltage induced in component L2 as inductor 135 when connected to an open or high impedance circuit as in view 100. The current 250 moves along direction 240, thereby generating maximum change in magnetic field and voltage induced in coil L2 as inductor 135. With a diameter of about 10 cm, the circuit L1 element 220, assuming a single turn carrying 10 kA of current, produces a magnetic field of 1.0 kG, which produces a flux of 0.75 mWb. For the coil L2 element 230, with one-hundred turns, being the same size as the circuit L1 element 220 so that this full flux is shared, and the circuit L1 element 220 passes by the coil L2 element 230 in 10 µs, then by Faraday's law in the eqn., the voltage generated in L2 element 230 is 7.5 kV.

Figure 3:
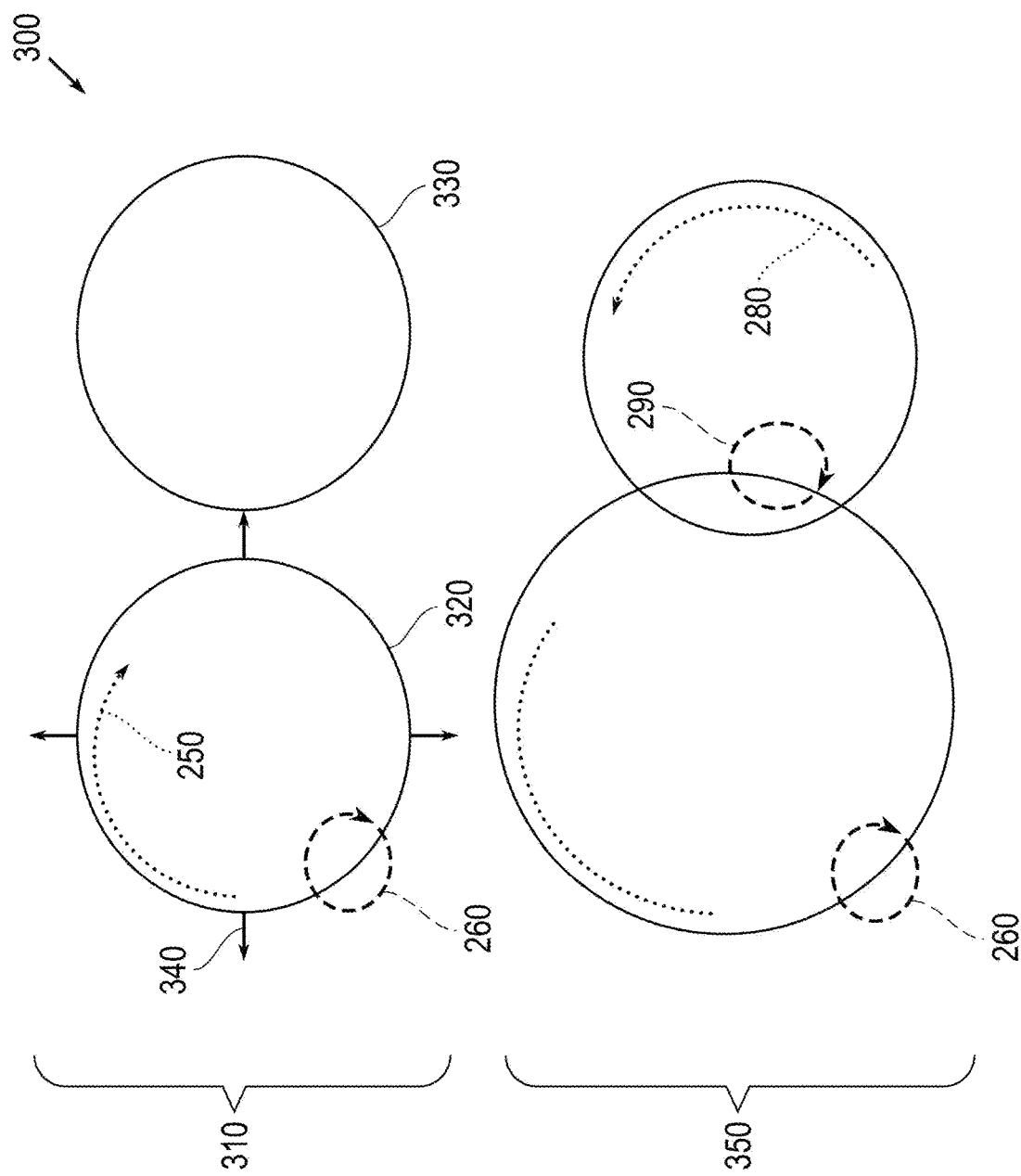
FIG. 3 is a diagram view of flux coupling between inductors via expansion.

FIG. 3 shows a diagram view 300 of a second example of geometric generation of changing field. A third configuration 310 includes an inductive circuit L1 element 320 in proximity to a coil L2 element 330, with the circuit L1 element 320 expanding in a radially outward direction 340. The circuit L1 element 320 has the clockwise internal current 250 and the second clockwise peripheral magnetic flux 260. A fourth configuration 350 is similar to third configuration 310 a moment later in time, and shows the circuit L1 element 320 partly overlapping the coil L2 element 330. The expansion overlap enables the current 250 to induce an anti-clockwise current 280 in coil L2 element 330, as well as induce a shared magnetic flux 290 while the initial magnetic flux 260 remains.

Depending on the nature of the pulse generator 120 that drives current in circuit L1 element 320, the current 250 changes, generally decreasing as circuit L1 element 320 expands. As circuit L1 element 320 expands, the increased field size passes across coil L2 element 330, creating a time-varying flux in coil L2 element 330. Again by Faraday's Law, coil L2 element 330 generates a large voltage if circuit L1 element 320 is an open circuit or impeded by resistance. Otherwise, the voltage drives a large current 260, if circuit L1 element 320 is a closed circuit.

Figure 4:
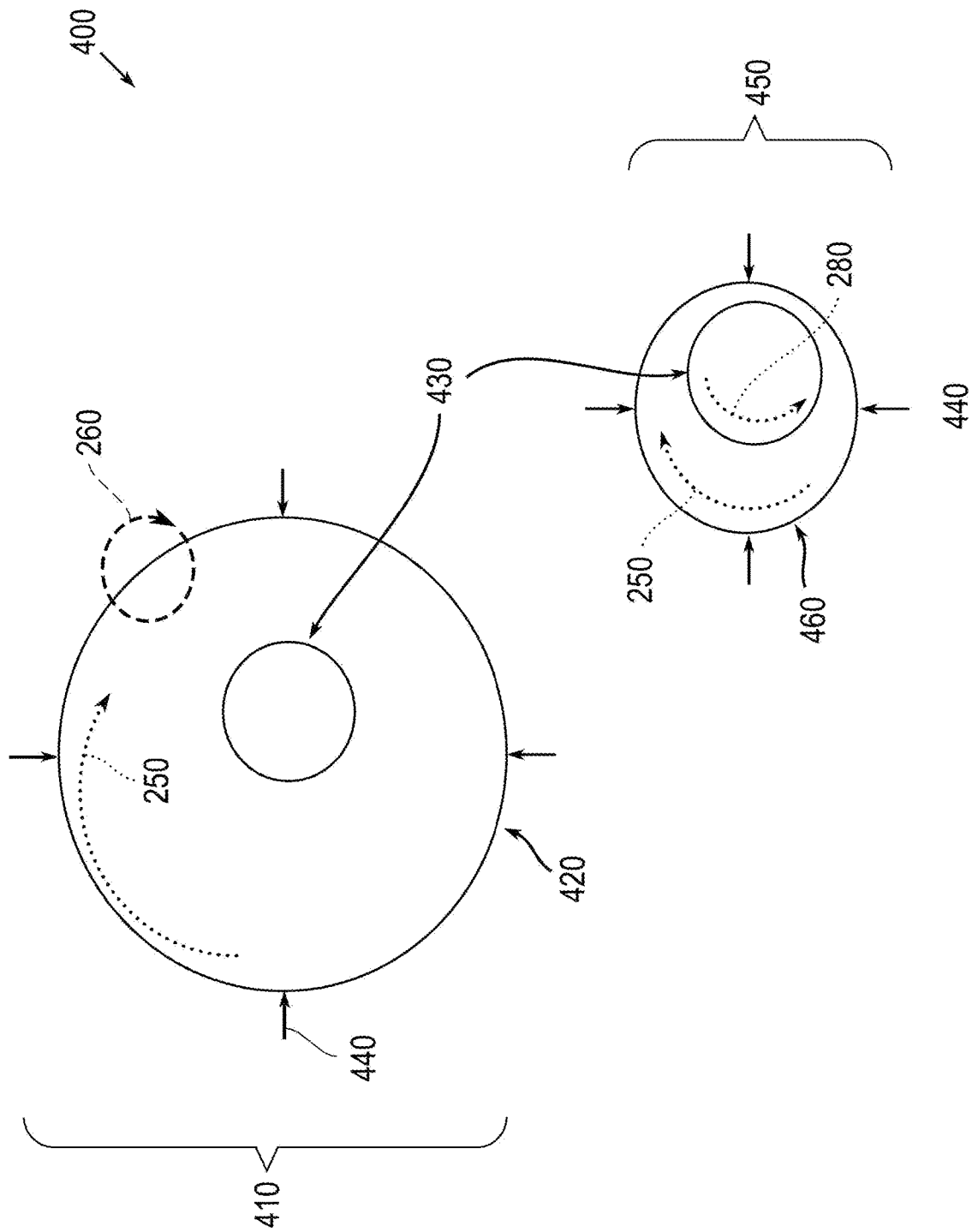
FIG. 4 is a diagram view of flux coupling between inductors via contraction.

FIG. 4 shows a diagram view 400 of a third example of geometric generation of changing field. A fifth configuration 410 includes an inductive circuit L1 element 420 enveloping a coil L2 element 430, with the L1 element 420 shrinking in a radially inward direction 440. The circuit L1 element 420 has the clockwise internal current 250 and the second clockwise peripheral magnetic flux 260. A sixth configuration 450 is similar to fifth configuration 410 a moment later in time, and shows the circuit L1 element 320 enveloping the coil L2 element 430 more tightly and compressing the current 250. The nature of the generator 120 is again important, but the current 250 generally increases.

The proximal envelopment compresses the current 250 and increases the coupled magnetic flux 290 (previously shown in views 200 and 300) to induce an anti-clockwise current 280 in coil L2 element 430 (if short circuited, or closed loop), and current 280 also serves to suppress the initial magnetic flux 260. If not shorted, a large voltage appears across the open or resistive load.

Figure 5:
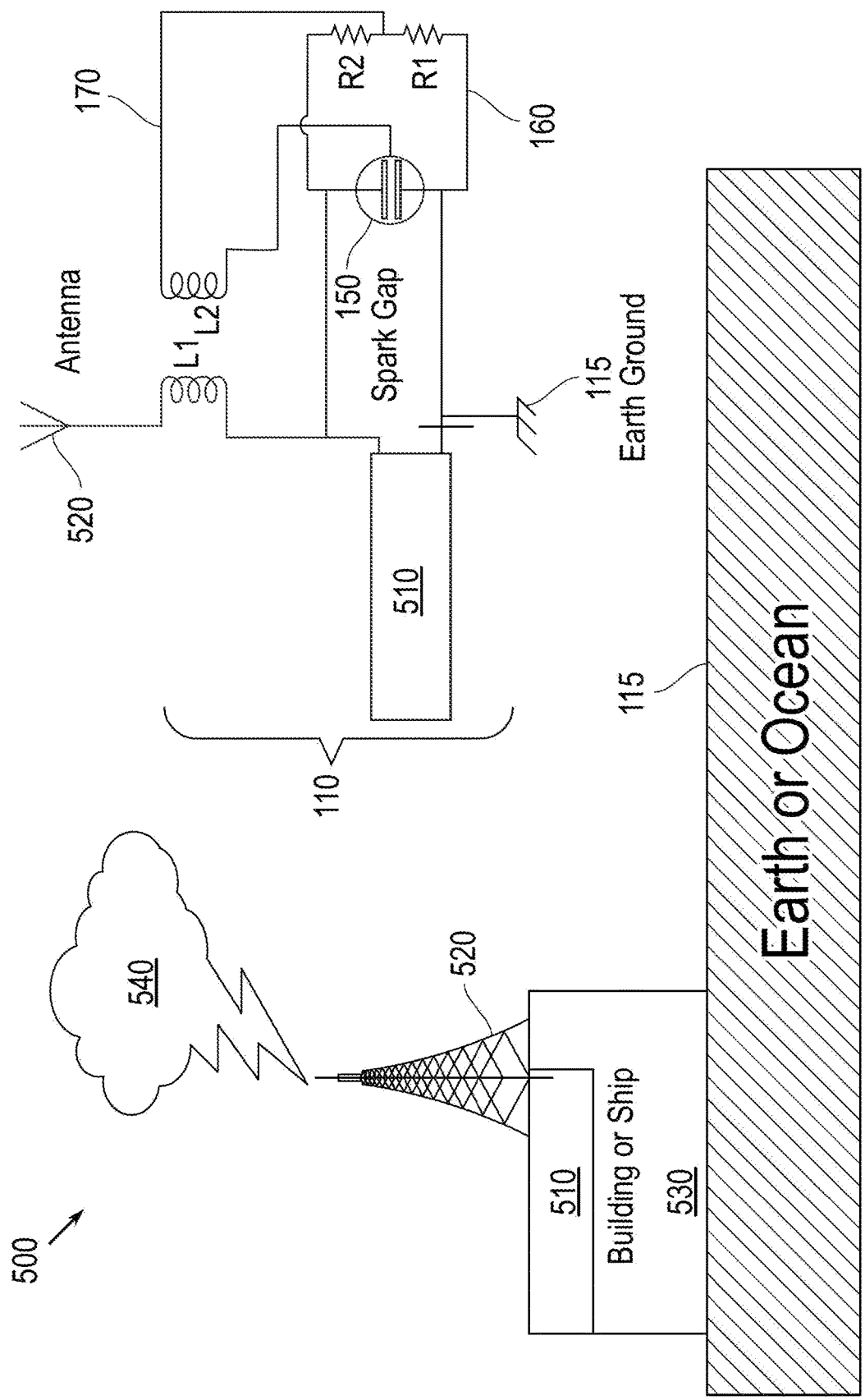
FIG. 5 is a diagram view of the exemplary device in a lightning discharge scenario.

FIG. 5 shows a schematic view 500 of an application of the exemplary circuit 110 to achieve direct lightning strike protection for an existing antenna circuit 510 for an antenna 520 on a building or ship 530 likely subject to such natural electrostatic discharge 540. This implementation has a circuit configuration 110 with the lighting strike discharge 540 acting as the source pulse 120. In this configuration, a lightning strike discharge 540 through the antenna 540 is diverted to ground 115 through the spark gap switch 150 that limits exposure to existing circuitry 710 involved in operation of the antenna 520.

According to table A-11 on p. 86 of MIL-STD-464C (available at http://everyspec.com/MIL-STD/MIL-STD-0300-0499/IMIL-STD-464C 28312/), the first strike lightning waveform includes a rise rate of 0.10 TA/s to 0.14 TA/s ($1.0 \times 10^{11}$ A/s-to $1.4 \times 10^{11}$ A/s) for 0.5 µs. If a 0 awg (American wire gauge) wire is wound in a loop with a radius of 25 cm and one turn, it will have an inductance of approximately 4.93 µH ($4.93 \times 10^{-6}$ H), when this is used as a source, L1 inductor 130 driven by a lightning strike creates a total changing flux of 0.493 MWb/s to 0.69 MWb/s ($4.93 \times 10^5$ Wb/s to $6.9 \times 10^5$ Wb/s). A second inductor L2 135 of identical radius in close proximity capturing one-tenth of this total flux and ten turns would generate 0.493 MV to 0.69 MV ($4.93 \times 10^5$ V to 6.9 $10^5$ V). This voltage is sufficient to trigger a gap of 16 cm under conditions near sea level.

Figure 6:
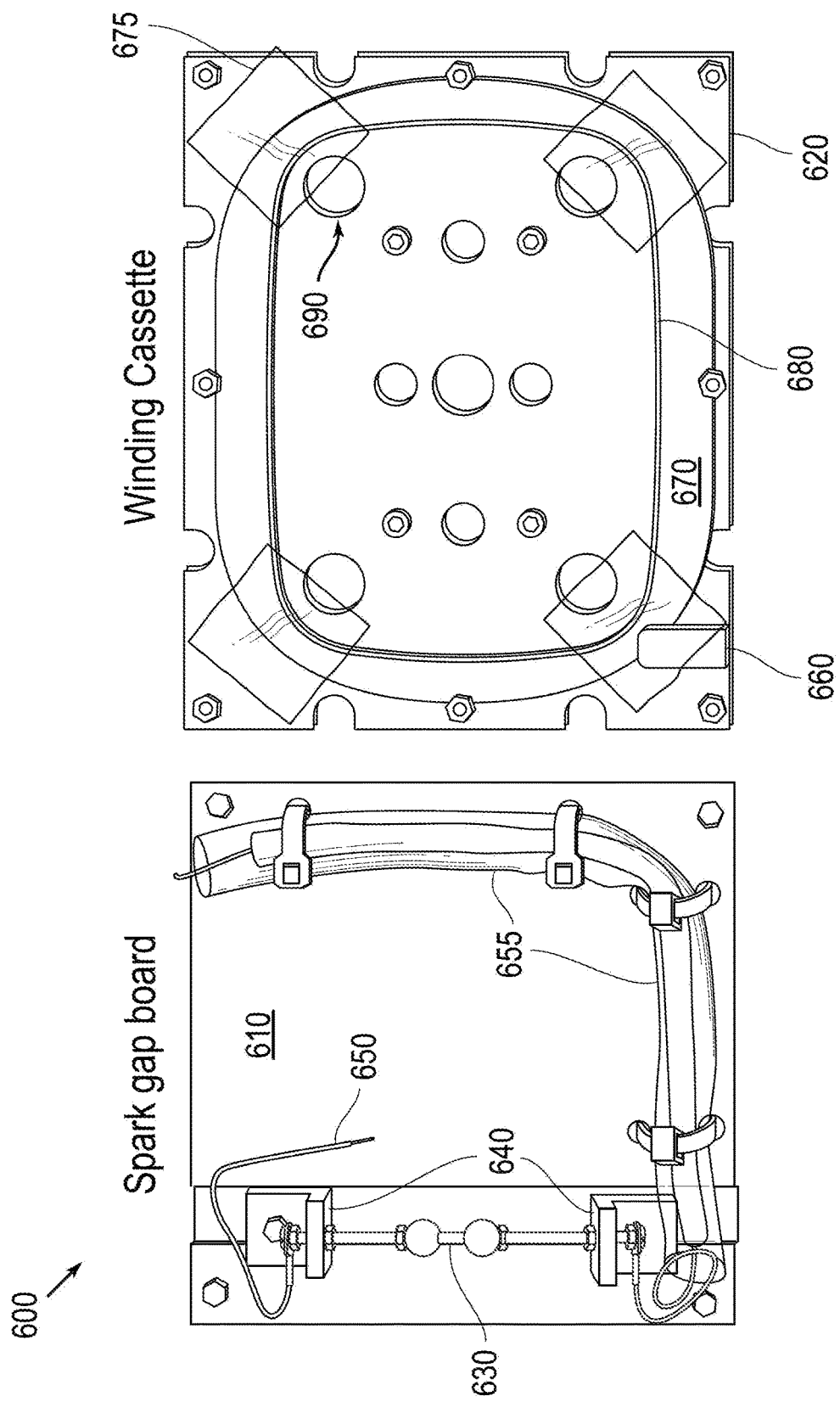
FIG. 6 is a photographic view of an exemplary spark gap and inductor hardware.

FIG. 6 shows a photographic view 600 of exemplary hardware of a spark gap board 610 and a winding cassette board 620. The spark gap board 610 includes a ball gap 630 with the leads attaching to support mounts 640 having wires 650 with insulation 655. These wires 650 serve as resistors 140 and 145. The cassette board 620 includes a trigger electrode 660 attached to one end of the wire winding 670, and four layers of polycarbonate sheet 675 securing multiple turns of wire 670 wound around a rigid form as a coil mandrel 680. The cassette board 620 is to be mounted such that the electrode 660 is in the vicinity of the ball gap 630. The other end of the wire winding 670 attaches to node 180. The cassette board 620 and mandrel 680 also include holes 690. Corner bolts 695 enable the cassette board 620 to be fastened.

Figure 7:
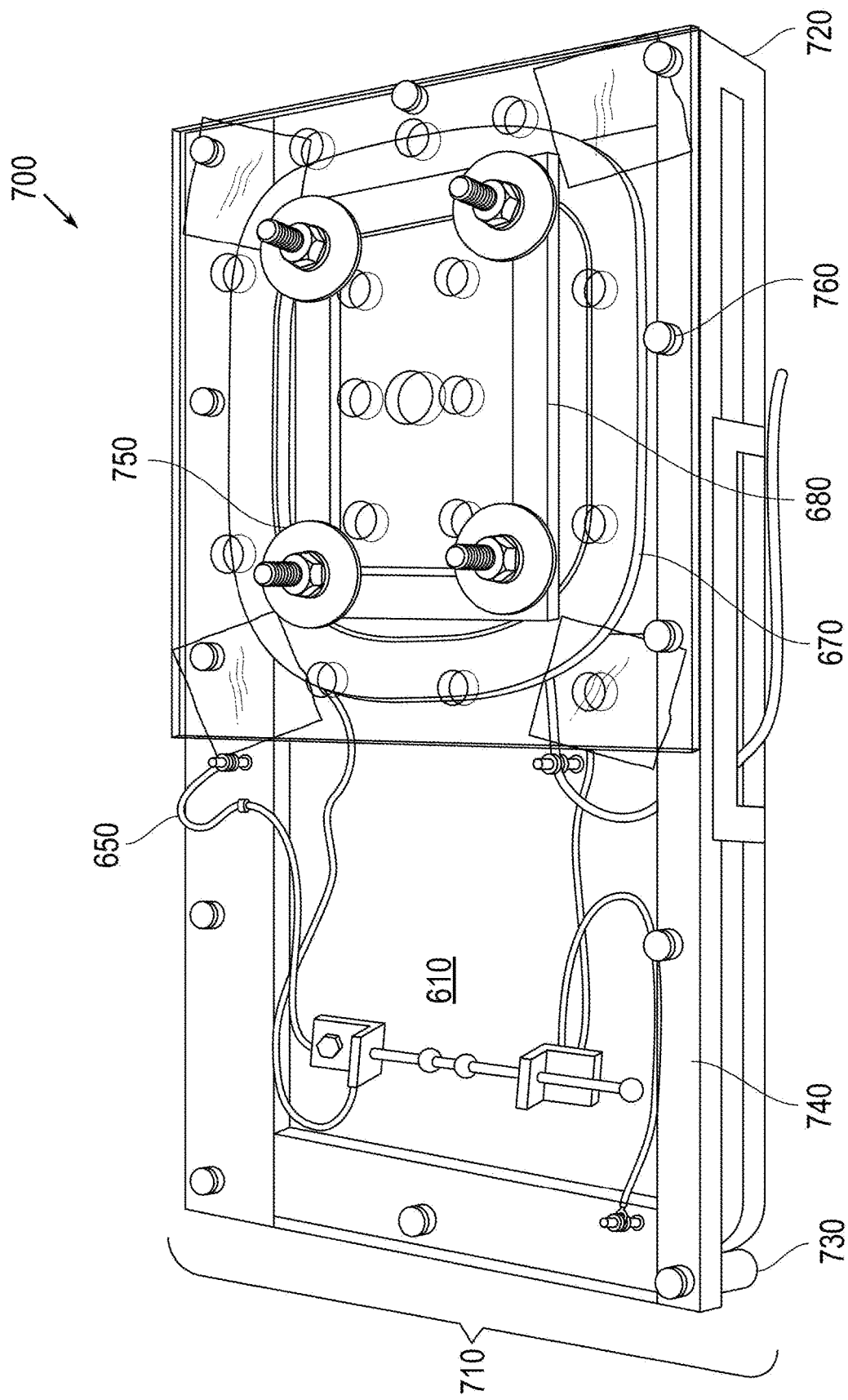
FIG. 7 is a photographic view of assembled prototype device for testing.

FIG. 7 shows a photographic view 700 of assembled hardware as an exemplary device 710 used in testing while magnetically coupled to a source circuit. This device 710 is housed in a protective perimeter frame 720 sandwiched between a base plate 730 and a lid plate 740.

The device 710 includes a single cassette board 620 with the wire 670 wound around the coil mandrel 680 secured by threaded fiberglass rods 750 that pass through holes 690. The device 710 further includes the spark gap board 610 connected with associated connectors 650, and external connections to monitor voltages for the spark gap 150 and the resistors 140 and 145. These components are enclosed in the protective frame 720 constructed of polycarbonate and nylon. This frame 720 mounts to a base plate 730 below and is covered by a lid plate 740 atop. Both plates 730 and 740 are constructed from polycarbonate and are secured to the frame 720 by fasteners 760.

The inductive elements in the exemplary circuit 110 and hardware device in views 600 and 700 may be stationary or there may be movement that aids in generation of changing magnetic field. If stationary, a change in current through L1 as inductor 130 is required to generate a changing magnetic field experienced by L2 as inductor 135. Alternatively if two elements 220 and 230 are moving relative to one another, the magnetic flux 260 from circuit L1 causes coil L2 to experience a changing magnetic field 290. In this case, the current 250 through circuit L1 does not need to be varying to create a varied field 290 experienced by coil L2. This outcome may alternatively be achieved if coil L2 were in motion and passing by circuit L1.

Changing field within the element area can also be achieved by expansion or contraction of the areas of the two inductive components L1 and L2 as shown in views 300 and 400. As inductor 130, circuit L1 is featured as element 320 or 420 changing but the same effect can be had with expansion or contraction of coil L2 as inductor 135 featured as element 330 or 430. The change in area may also be in one direction or dimension, or many as illustrated. The important aspect of proper function is changing overlapping areas or coupling to create a magnetic flux 290 experienced by coil L2 through geometrical changes.

The photographic view 600 shows a cassette style prototype that utilizes coil cassettes to control the effective loop area of coil L2 as inductor 135. This design utilizes a changing current and geometry of L1 130 as inductor 130 to generate flux within L2 135. The coil mandrel 680 measures 21.27 cm (8.38 inches) in length and 15.24 cm (6.00 inches) in width, creating a loop area of 324 cm$^2$ per turn.

The winding cassette board 620 is constructed of polycarbonate sheets of 1.9 cm and 0.32 cm thicknesses bolted together with rods 750 intended to be stackable, utilizing copper contacts to easily vary the number of cassettes and therefore the total number of turns in the coil. The outer dimensions of the polycarbonate plates 730 and 740 are unimportant to the operation of the exemplary device 710. The cassette board 620 is wound with 18 awg magnet wire 670 around the mandrel 680 with nomex paper inserted between layers of wraps for electrical and mechanical isolation. The photographed cassette board 620 contains a total of 88.5 turns.

This prototype device 710 also utilizes an overvoltage triggering technique to close the spark gap 630. Later designs are intended to incorporate an ignition pin. The spark gap board 610 includes two 1 MΩ resistors 650 in series and an adjustable spark gap 630 mounted off of the surface of the board 610 with nylon mounts 640 to increase high voltage tracking lengths. The spark gap 150 is constructed with corona balls as the ball gap 630 mounted to screws that are threaded into the mounts 640 to enable a wide range of potential spark gap distances. The spark gap board 610 is 7.50 inches square.

FIG. 7 shows a photographic view 700 of a prototype device 710 that was demonstrated to generate in excess of 20 kV reliably when coupled with an existing source circuit. This output level exceeds the voltage needed to trigger the spark gap 630 of 0.3 cm used in that circuit 160. The photographed prototype corresponds to the mandrel dimensions to the device 710 in view 700, and has a total of 99.75 turns of 30 kV rated 18 awg wire.

Figure 8:
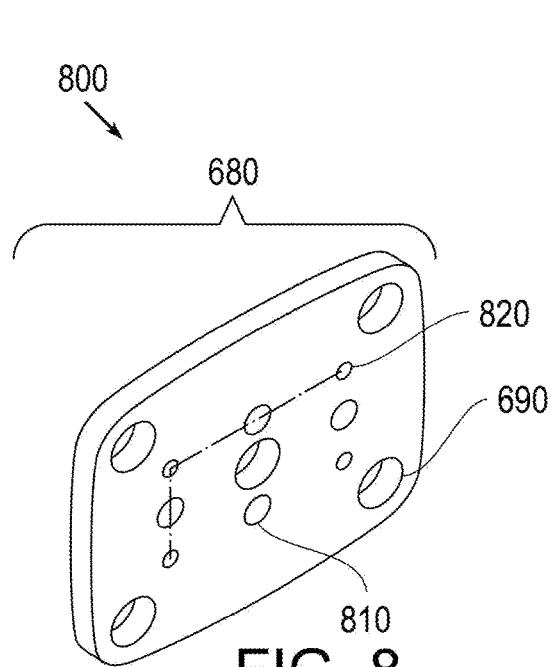
FIG. 8 is an isometric view of a winding coil mandrel.

FIG. 8 shows an isometric view 800 of the polycarbonate coil mandrel 680 onto which the conductor wire 670 is wound. A hole pattern is shown within the mandrel 680. These include diagonal cross holes 690 for rods 750, diamond pattern holes 810 and rectangular pattern holes 820. The mandrel 680 has a length of 8.38 inches, a width of 6.00 inches and a thickness of 0.50 inch. The cross holes 690 have a diameter of 1.00 inch disposed 3.11 inches from the board's center.

Figure 9:
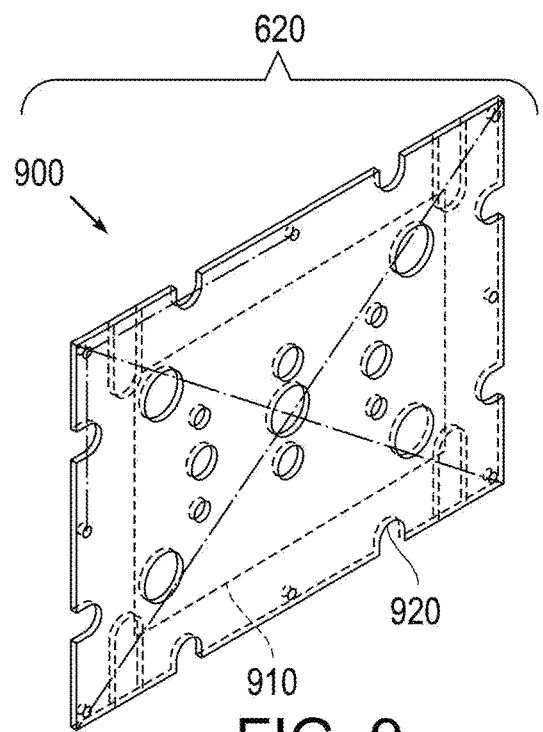
FIG. 9 is an isometric view of a mandrel side plate.
Figure 10:
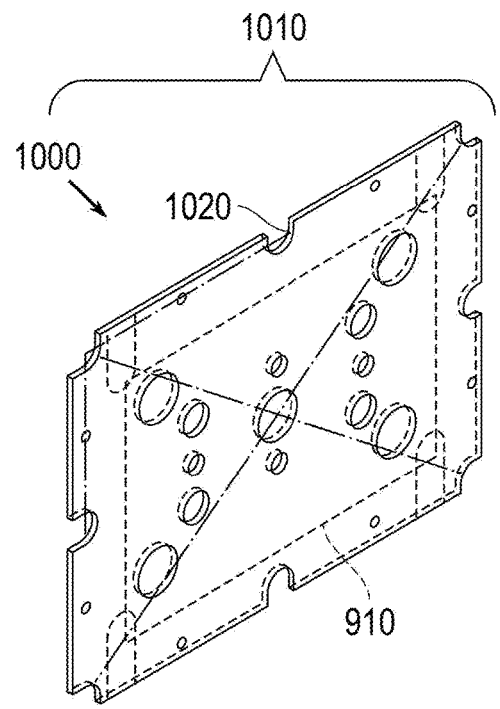
FIG. 10 is an isometric view of an alternate mandrel side plate.

FIG. 9 shows an isometric view 900 of the cassette board 620 onto which the mandrel 680 bolts thereon to contain the conductor wire 670. The board 620 further includes a hole pattern 910 that corresponds to the holes 690, 810 and 820 in their patterns, as well as cutouts 920 for fastening to the base plate 730. The board 620 has a length of 10.62 inches, a width of 8.25 inches and a thickness of 0.13 inch. FIG. 10 shows an isometric view 1000 of an alternate winding cassette board 1010 having the same overall dimensions and hole pattern 910 as the board 620, but different arrangement of cutouts 1020.

Figure 11:
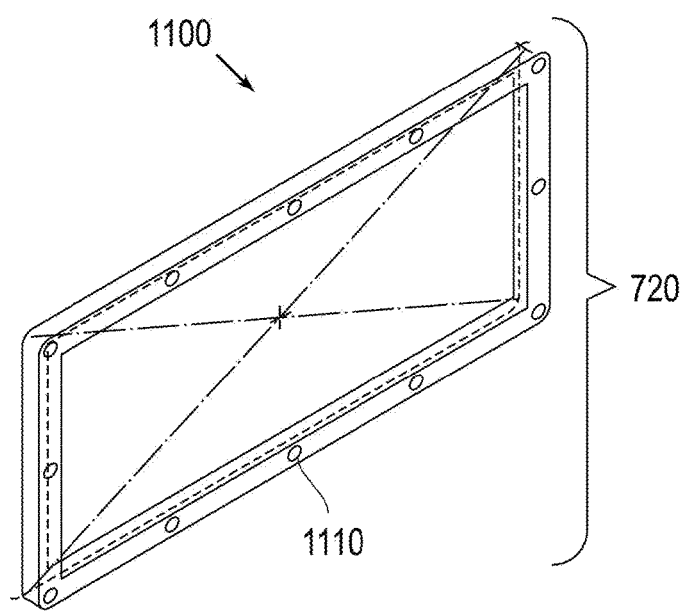
FIG. 11 is an isometric view of a perimeter frame.
Figure 12:
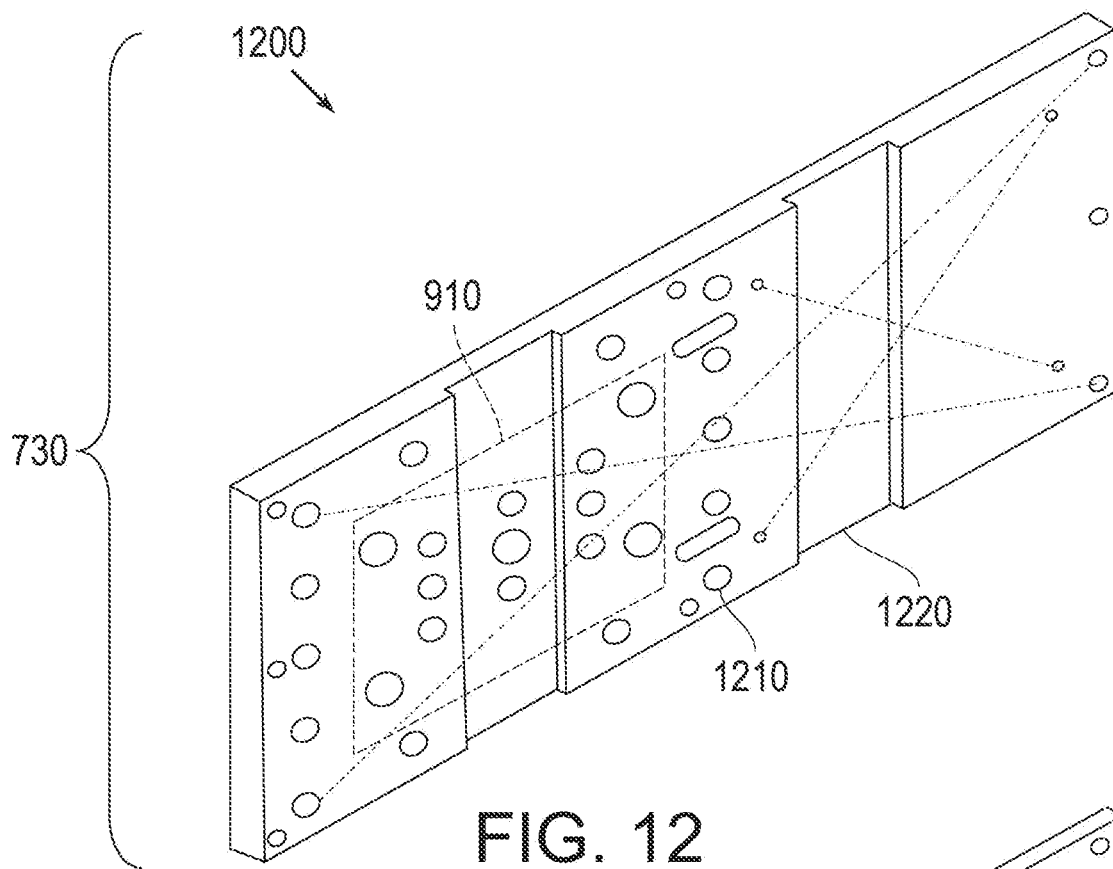
FIG. 12 is an isometric view of a base plate.
Figure 13:
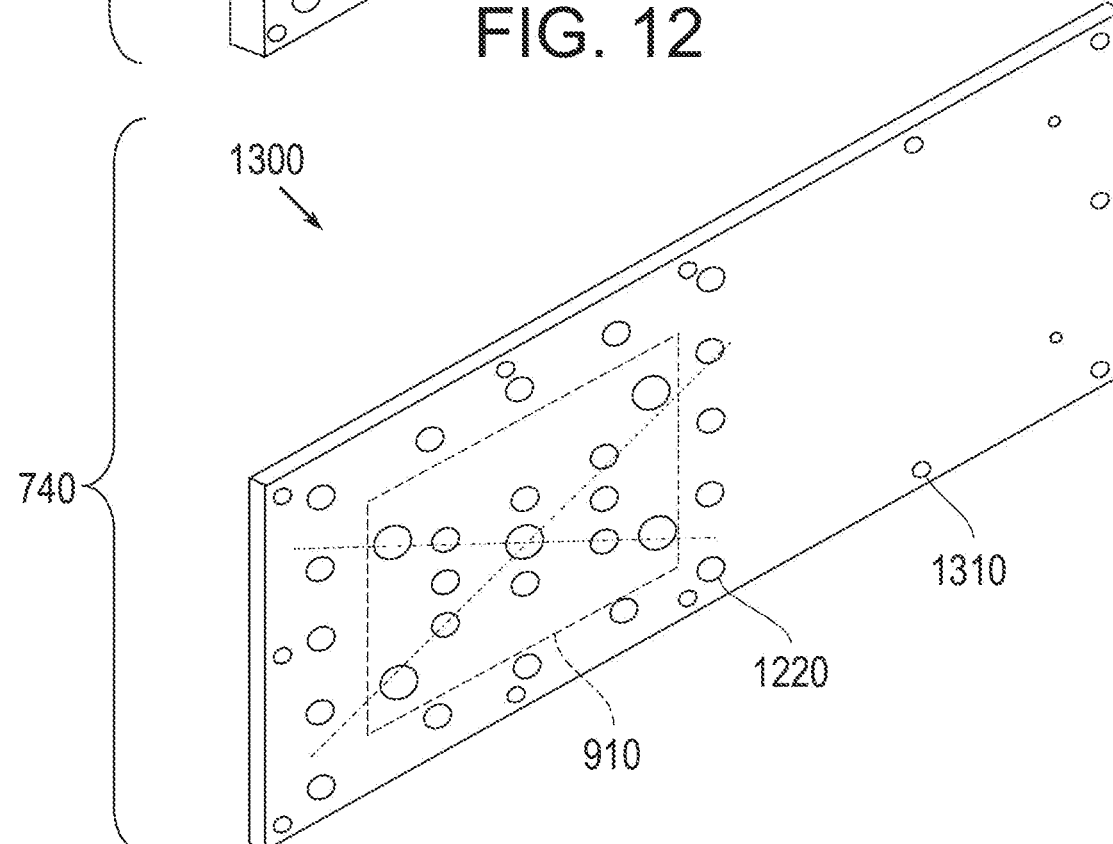
FIG. 13 is an isometric view of a lid plate.

FIG. 11 shows an isometric view 1100 of the perimeter frame 720 with holes 1110 for fasteners 760 to secure the device 710. The perimeter frame 720 has a length of 21.13 inches, a width of 9.75 inches and a thickness of 0.75 inch. The perimeter frame 720 attaches to base and lid plates with non-conductive fasteners. Such frames 720 can be concatenated with insulation in a stack between the plates 730 and 740. FIG. 12 shows an isometric view 1200 of the base plate 730, which includes the hole pattern 910 along with a pair of hole series 1210 across the width and a pair of wide grooves 1220. FIG. 13 shows an isometric view 1300 of the lid plate 740, which includes the hole pattern 910 along with a peripheral hole series 1310 aligning with the holes 1110 on the frame 720 to receive the fasteners 760. Note that all mechanical dimensions are exemplary and not limiting.

Exemplary embodiments simplify the implementation of spark gap triggering in some applications. The exemplary device 710 is powered by the existing circuit's magnetic energy and automatically determines trigger timing by geometric configuration and/or shape of the existing pulse's current through an inductive element. These features are novel for spark gap triggering. Multiple devices 710 can also be used to create multiple triggers when conditions in the exemplary circuit 110 are satisfied.

Because the spark gap trigger device 710 is driven by the exemplary circuit 110 and not by an independent control mechanism, the device will always trigger at the appropriate time and is not susceptible to control errors or external power failures or variations. The exemplary device 710 also is smaller and lighter in some applications than an alternative method of triggering, as well as possessing inherent high voltage safety improvements as no energy is stored by the device external to the induced time frame, and any high voltage generated dissipates after the triggering event. The exemplary device 710 lends itself well to explosively driven circuits, highly kinetic electromagnetic circuits, and high frequency circuits that spark gaps are viable for use within.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. A magnetic induction trigger device for initiating an electric discharge within a spark gap in response to a transient pulse voltage generator, said device comprising:
   a voltage discharge element having a pair of terminals and a gate electrode disposed across said pair of terminals for initiating the spark gap;
   a resistor series having first and second resistors that join at a node;
   a receiver circuit in which said resistor series and said discharge element are disposed in parallel, with each terminal of said discharge element connecting to a respective resistor of said resistor series; and
   an inductor connecting at said node between said first and second resistors to said gate electrode of said discharge element, wherein a magnetic flux transient from the voltage generator to said inductor induces transient voltage onto said gate electrode responsive to said inductor temporarily overlapping said receiver circuit.

2. The device according to claim 1, wherein the triggering of said discharge element is accomplished by geometrical disposition of said inductor and said receiver circuit.

3. The device according to claim 1, further including an auxiliary induction component connected in parallel within said receiver circuit.

4. The device according to claim 3, wherein said receiver circuit passes said induction component by one of translation, expansion and contraction.

5. The device according to claim 3, wherein
said induction component and said inductor each have a diameter of 10 cm,
said induction component carries 10 kA of current, and
said inductor has one-hundred turns to generate 7.5 kV potential.

6. The device according to claim 1, wherein said receiver circuit includes an antenna that connects to the voltage generator.

7. The device according to claim 1, wherein said pair of terminals has a separation of 0.1 cm to provide potential of 3.0 kV on said gate electrode, and said first and second resistors each have resistances of 1.0 kΩ.

8. A magnetic induction trigger device for initiating an electric discharge within a spark gap in response to a transient pulse voltage generator, said device comprising:
a voltage discharge element having a pair of terminals and a gate electrode disposed across said pair of terminals for initiating the spark gap;
a resistor series having first and second resistors that join at a node;
a receiver circuit in which said resistor series and said discharge element are disposed in parallel, with each terminal of said discharge element connecting to a respective resistor of said resistor series; and
an inductor connecting at said node between said first and second resistors to said gate electrode of said discharge element, wherein
said pair of terminals has a separation of 0.1 cm to provide potential of 3.0 kV on said gate electrode,
said first and second resistors each have resistances of 1.0 kΩ,
said inductor has a diameter of 10 cm and one-hundred turns to generate 7.5 kV potential, and
a magnetic flux transient from the voltage generator to said inductor induces transient voltage onto said gate electrode responsive to said inductor temporarily overlapping said receiver circuit.

9. The device according to claim 8, further including an induction component to carry 10 kA of current connected in parallel within said receiver circuit.

* * * * *